(12) United States Patent
Partovi et al.

(10) Patent No.: US 6,440,839 B1
(45) Date of Patent: Aug. 27, 2002

(54) SELECTIVE AIR GAP INSULATION

(75) Inventors: Hamid Partovi, Sunnyvale; Chun Jiang; Bill Yowjuang Liu, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,800

(22) Filed: Aug. 17, 2000

Related U.S. Application Data
(60) Provisional application No. 60/149,441, filed on Aug. 18, 1999.

(51) Int. Cl.[7] .............................................. H01L 21/768
(52) U.S. Cl. .................. 438/619; 438/422; 257/522
(58) Field of Search .................. 438/411–412, 619, 438/637, 422; 257/522

(56) References Cited

U.S. PATENT DOCUMENTS

| | | | | |
|---|---|---|---|---|
| 5,407,860 A | * | 1/1995 | Stoltz et al. ................. | 438/619 |
| 5,512,775 A | * | 4/1996 | Cho ............................. | 257/522 |
| 5,641,712 A | * | 6/1997 | Grivna et al. ................ | 438/624 |
| 5,949,143 A | * | 9/1999 | Bang ........................... | 257/758 |
| 6,165,897 A | * | 12/2000 | Jang ............................ | 438/637 |
| 6,189,845 B1 | * | 12/2000 | Yew et al. ................... | 438/637 |

FOREIGN PATENT DOCUMENTS

| | | | | |
|---|---|---|---|---|
| JP | 63-098134 | * | 4/1988 | ............ H01L/21/90 |
| JP | 02-151032 | * | 11/1990 | ......... H01L/21/316 |
| JP | 07-326670 | * | 12/1995 | ......... H01L/21/768 |

OTHER PUBLICATIONS

B. Shiek et al., Air–Gap Formation During IMD Deposition to Lower Interconnect Capacitance. IEEE 1998, pp. 16–18.*

* cited by examiner

Primary Examiner—Olik Chaudhuri
Assistant Examiner—Anh Duy Mai

(57) ABSTRACT

Air gap insulation regions are formed selectively within high parasitic capacitance regions in which conductive lines are closely proximate and generates an intolerable amount of parasitic capacitance. The selective formation of air gap insulation regions improves circuit performance by reducing the parasitic capacitance and device reliability by reducing the stress fracture problem of conventional air gap insulation schemes.

6 Claims, 7 Drawing Sheets

SELECTIVE AIR GAP INSULATION

RELATED APPLICATIONS

This application claims priority from Provisional Application Ser. No. 60/149,441, filed on Aug. 18, 1999, the entire disclosure of which is hereby incorporated by reference therein.

FIELD OF THE INVENTION

The present invention relates to semiconductor devices and manufacturing processes, and more particularly to methods for reducing parasitic capacitance created during the formation of interlayer dielectrics within a semiconductor device.

BACKGROUND OF THE INVENTION

Integrated circuits fabricated on semiconductor substrates for Ultra Large Scale Integration (ULSI) require multiple layers of metal interconnections for electrically interconnecting the discrete semiconductor devices on the semiconductor chips. In the more conventional method the different levels of interconnections are separated by a dielectric material. Silicon oxide has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. As device dimensions decrease and the packing density increases, it is necessary to reduce the spacing between conductive lines to effectively wire up the integrated circuits. The capacitance C between two conductive lines is determined as follows:

$$C = keA/d$$

where k is the dielectric coefficient, e is the permittivity of the dielectric material, A is the area, and d is the spacing between conductive lines. As shown, the capacitance C is inversely proportional to the spacing d between the conductive lines. Accordingly, when the spacing between the conductive line decreases and a dielectric material having the same dielectric constant is used, the capacitance C increases. Therefore, it is very desirable to minimize the dielectric constant k of the dielectric material between the conductive lines in order to reduce the capacitance C.

Recently, attempts have been made to use low-density materials having a lower dielectric constant to replace dense silicon oxide. One approach to minimize the capacitance is to use a low k material, e.g., HSQ (k=2.7~3.0) or parylene (k<2.5). However, some issues, such as low thermal stability, poor adhesion and failures related to vias, make it difficult to apply low k materials to insulation processes. Another method being proposed to lower the dielectric constant is to form air gaps between the interconnect lines. While silicon oxide has a dielectric constant of about 4 and greater, the dielectric constant of air is about 1.

A method for forming air gap dielectric spaces between interconnect lines is disclosed in U.S. Pat. No. 5,407,860 assigned to Stoltz et al. The method according to Stoltz at al. may be understood by reference to FIG. 2A to FIG. 2F.

FIG. 2A depicts a cross-section of a portion of a semiconductor wafer during a step of the local interconnect formation process. A conductive layer 22 is formed over a semiconductor substrate 20, and a patterned photoresist layer 24 is formed over the conductive layer 22. The material for the conductive layer 22 is typically a metal, a metal alloy, or polysilicon. The photoresist layer 24 has a plurality of etch windows 26a, 26b that expose portions of the conductive layer 22 which are later to be removed from the surface of the substrate 20.

In FIG. 2B, the semiconductor wafer is placed within an etching tool and a conductive layer etching process is performed to remove the portions of the conductive layer 42 that are located below the etch windows 26a, 26b, thereby forming a plurality of conductive lines 28, and spacing 30a, 30b between the conductive lines 28.

In FIG. 2C, a first dielectric layer 32 which forms a non-wetting surface is deposited over the substrate 20 and the conductive lines 28. Such a material suggested by Stoltz et al. is a copolymer made from tetraflouroethylene and 2,2-bis (tritluoromethyl)-4,5-difluoro-1,3-dioxole (TFE AF).

In FIG. 2D, the dielectric layer 32 is then etched by conventional anisotropic etching techniques to remove it from the top surfaces of the conductive lines 28 and the substrate 20, but leave it on the side surfaces of the conductive lines 28, thereby forming sidewall spacers 34 having non-wetting surfaces on the side surfaces of the conductive lines 28.

In FIG. 2E, a second dielectric layer 36, such as spin-on-glass (SOG) is deposited over the substrate 20 and conductive lines 28. The non-wetting dielectric sidewall spacers 34 discourage deposition of the second dielectric layer 36 in the spacing 30a, 30b and aids the formation of air gaps 38a, 38b within the spacings 30a, 30b. It is known that gases or at least partial vacuums are typically contained within the air gaps 38a, 38b.

In FIG. 2F, the second dielectric layer 36 is planarized, along with any other subsequent processing required to complete the semiconductor wafer. One significant problem associated with the method described in Stoltz et al. is the stress fracture formed in the second dielectric layer 36. As shown in FIG. 2F, while a portion of the second dielectric layer 36 overlying the air gap 38b may not suffer from the stress fracture problem, portions 40 of the second dielectric layer 36 overlying the air gaps 38a suffer an intolerable amount of stress fracturing because of the insufficient support from underneath the portions 40. This stress fracture problem can cause many problems, for example, distortion of the surface of the second dielectric layer overlying the portions 40, thereby resulting in a rough dielectric surface. One problem associated with such rough surfaces of the second dielectric layer 36 is that it is difficult to pattern features on the second dielectric layer 36 to the maximum resolution of the steppe thereby possibly resulting in inaccurate formation of patterns on the second dielectric layer 36 and via contacts.

Therefore, there is still a need in the semiconductor industry for a method for implementing an air gap insulation scheme without creating a stress fracture problem within overlying dielectric layers.

SUMMARY OF THE INVENTION

These and other needs are met by the present invention which provides a method of selectively forming air gap insulation regions in a semiconductor device arrangement to reduce the parasitic capacitance and to prevent the stress fracture problem. The present invention also provides a semiconductor device structure in which such air gap insulation regions are strategically arranged to reduce the parasitic capacitance and to prevent the stress fracture problem.

The method in accordance with the present invention includes forming a plurality of conductive lines on a substrate, wherein the conductive lines comprise first portions having a first distance between two proximate conductive lines and second portions having a second distance greater than the first distance between the two proximate conductive lines. At least one air gap insulation region is formed between the first portions of the two proximate conductive lines. A covering dielectric layer is formed over the substrate, the plurality of conductive lines, and the air gap insulation region. In certain embodiments of the present invention, an initial dielectric layer which normally comprises a low k material is formed on the substrate between the second portions of the plurality of conductive lines.

The semiconductor device arrangement in accordance with the present invention comprises a substrate and a plurality of conductive lines formed on the substrate. The plurality of conductive lines comprise first portions having a first distance between two proximate conductive lines and second portions having a second distance greater than the first distance between two proximate conductive lines. At least one air gap insulation region is formed on the substrate between the first portions of the two proximate conductive lines. A dielectric layer covers the substrate, the plurality of conductive lines, and the at least one air gap insulation region.

Hence, the selective formation of an air gap insulation region only between two closely proximate conductive lines lowers parasitic capacitance. This has an advantage of improving the operating performance of the chip. Another important advantage of the selective formation of such the air gap insulation region is the ability to reduce the stress fracture of the covering dielectric layer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of an integrated circuit device during fabrication are not drawn to scale, but instead are drawn to illustrate the feature of the present invention.

In accordance with certain embodiments of the present invention, methods are provided that substantially reduce parasitic capacitance between conductive lines during the formation of interlayer dielectric layers. As part of the present invention, it was recognized that two closely proximate conductive lines can generate an excessive amount of parasitic capacitance, which increases the RC time delay of the circuit and decreases the circuit performance. Thus, in accordance with the present invention, air gap insulation regions are selectively formed in areas in which two closely proximate conductive lines could generate an excess amount of parasitic capacitance. Since the air gap insulation regions are selectively formed in these selective areas, the stress fracture problem of the covering dielectric layer is significantly reduced. As such, the method of the present invention increases device performance by reducing parasitic capacitance and improves device reliability by avoiding stress fractures.

Figure 1A:
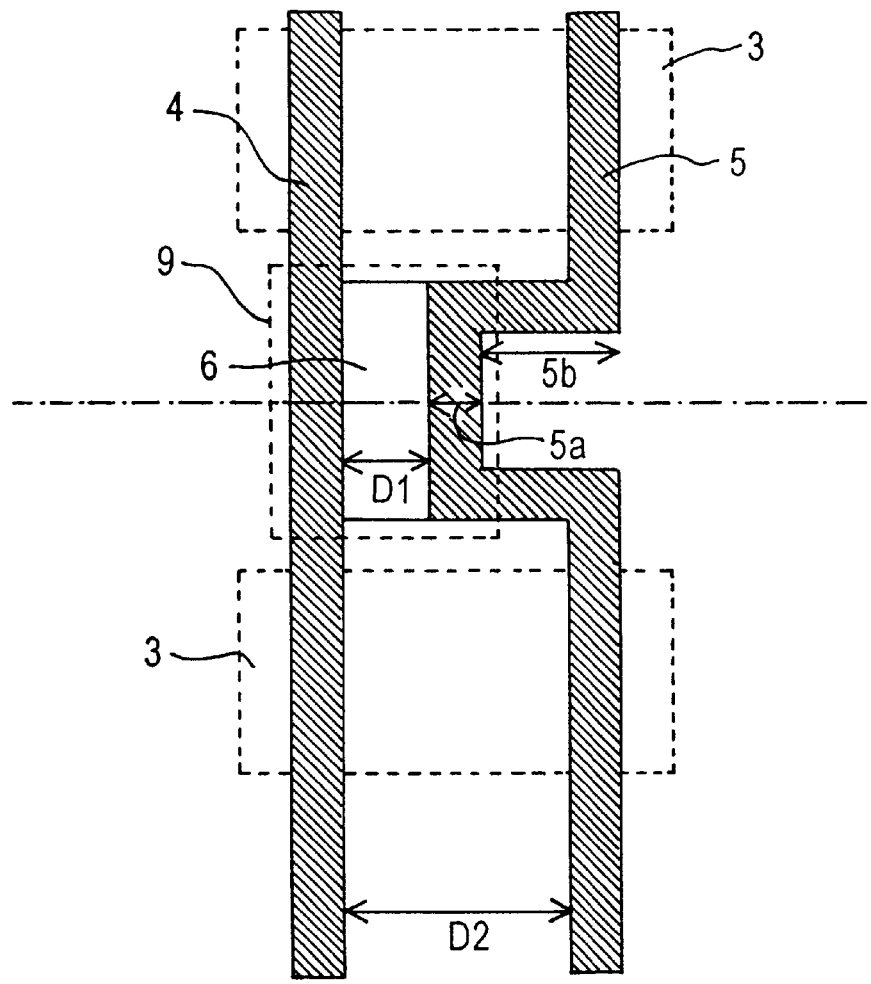
FIG. 1A depicts a top-view of a portion of a semiconductor wafer which comprises two neighboring conductive lines and an air gap insulation region formed on a semiconductor substrate, in accordance with an embodiment of the present invention.
Figure 1B:
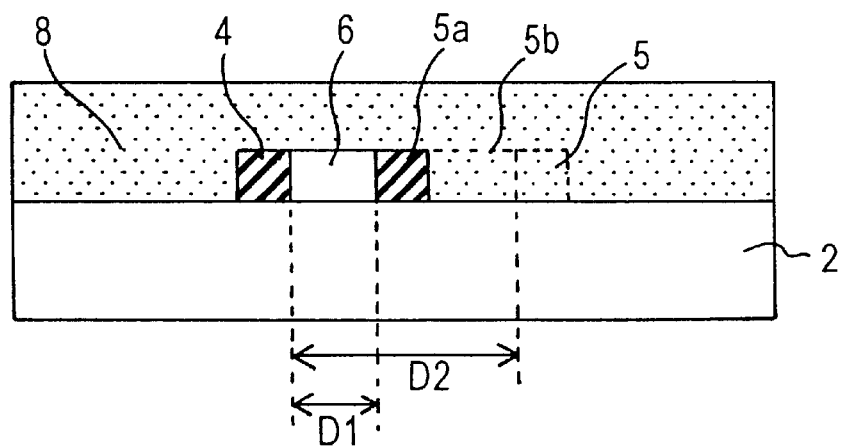
FIG. 1B depicts a cross-section of the portion of FIG. 1A, further showing a covering dielectric layer formed over the portion, in accordance with an embodiment of the present invention.
Figure 2A:
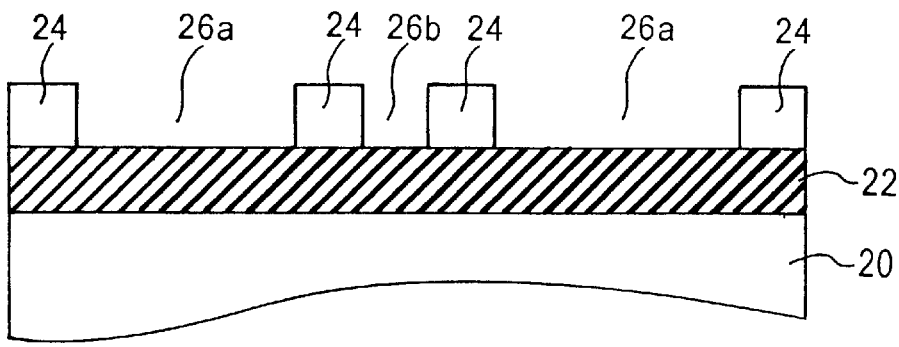
FIG. 2A depicts a cross-section of a portion of a prior art semiconductor wafer which comprises a substrate, a conductive layer and a patterned photoresist layer.
Figure 2B:
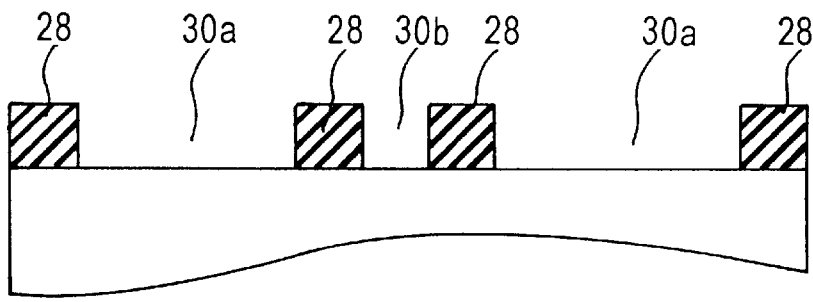
FIG. 2B depicts the portion of FIG. 2A, following a conductive line etching process.
Figure 2C:
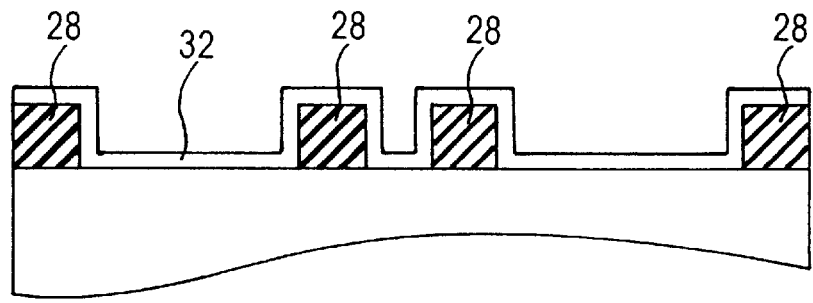
FIG. 2C depicts the portion of FIG. 2B, following a first dielectric layer deposition process.
Figure 2D:
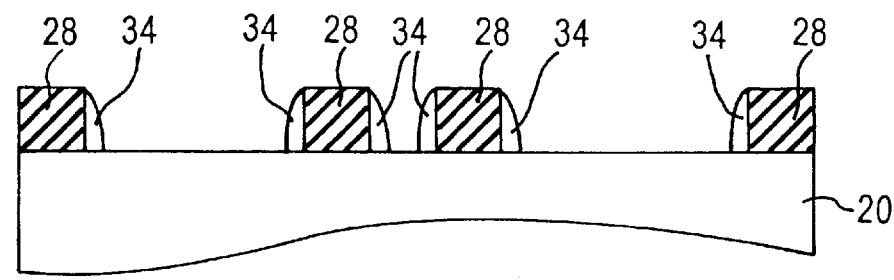
FIG. 2D depicts the portion of FIG. 2C, following an anisotropic etching process of the first dielectric layer.
Figure 2E:
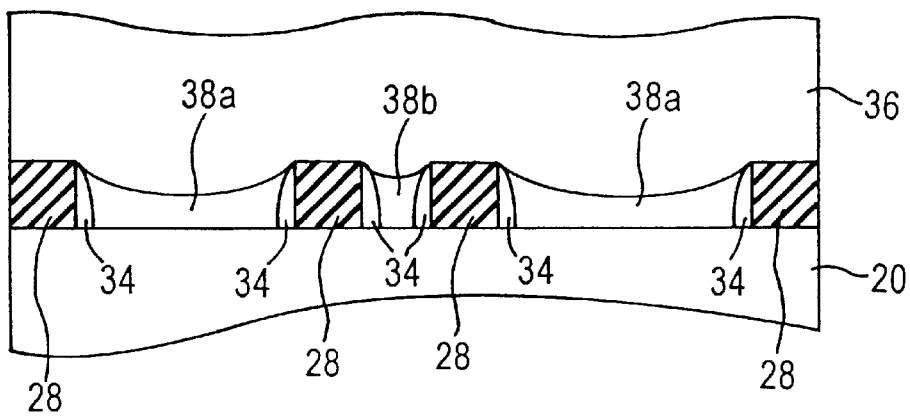
FIG. 2E depicts the portion of FIG. 2D, following a second dielectric layer deposition process in which a plurality of air gaps are formed between the conductive lines.
Figure 2F:
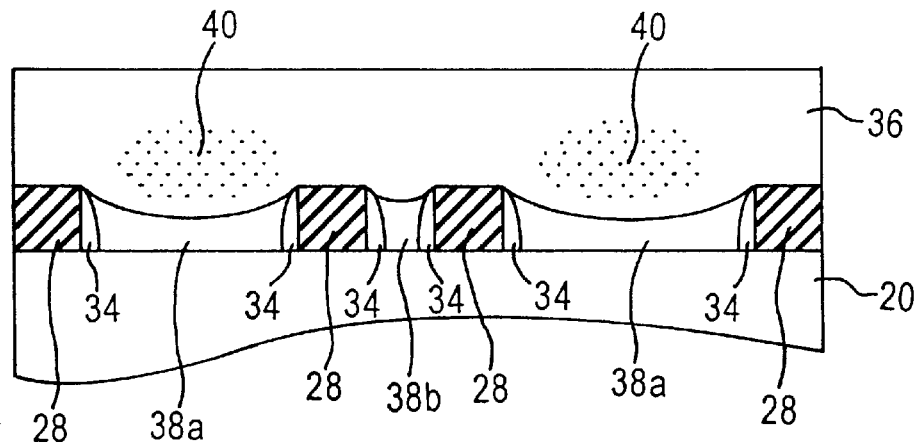
FIG. 2F depicts the portion of FIG. 2E, following a planarization process of the second dielectric layer.

With this in mind, FIG. 1A depicts a top view of a portion of a semiconductor wafer and FIG. 1B depicts a cross-sectional view of the portion of FIG. 1A, in accordance with an exemplary embodiment of the 35 present invention. The portion comprises a semiconductor substrate 2 in FIG. 1B, and active regions 3 in FIG. 1A, e.g., source and drain regions, are formed in the substrate 2. A plurality of conductive lines 4, 5 are formed on the substrate 2, providing conductive paths to the active regions 3. A covering dielectric layer 8 in FIG. 1B is formed over the substrate 2 and conductive lines 4, 5. The depicted portion further comprises a high parasitic capacitance region 9 where the distance Dl between the conductive lines 4, 5 is substantially S small enough to cause an excessive amount of parasitic capacitance. In accordance with the present invention, at least one air gap region 6 is selectively formed between portions of the conductive lines 4, 5 in the high parasitic capacitance region 9. The air gap insulation region 6 selectively formed only in the high parasitic capacitance region 9 prevents creation of a stress fracture in the portion of the covering dielectric layer 8 overlying the air gap insulation region 6.

Figure 3A:
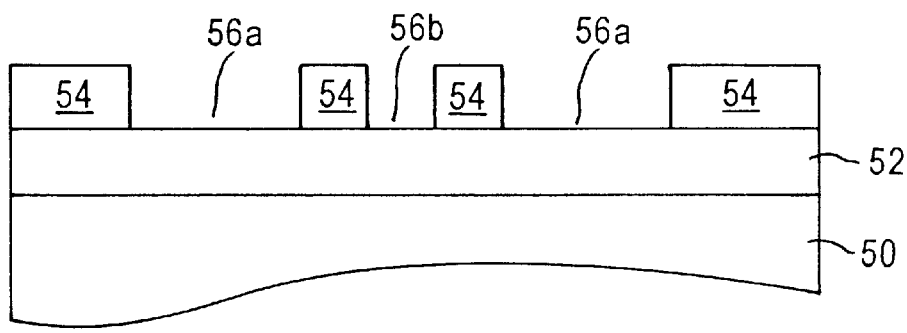
FIG. 3A depicts a cross-section of a portion of a semiconductor wafer having a substrate, an initial dielectric layer, and a patterned photoresist layer, in accordance with an embodiment of the present invention.

With this in mind, FIG. 3A depicts a cross-section of a portion of a semiconductor wafer including a high parasitic capacitance region such as shown in FIG. 1A in accordance with the present invention. The portion includes a substrate 50 and an initial dielectric layer 52 formed on the substrate 50. For example, in certain embodiments of the present invention, initial dielectric layer 52 comprises a low k dielectric material, e.g., benzocyclobutene (BCB), hydrogen silisesquioxane (HSQ) or FLARE. A photoresist layer 44 is formed on initial dielectric layer 52 and patterned with the desired features that are to be formed in the initial dielectric layer 52 by creating etch windows 56a and 56b.

Figure 3B:
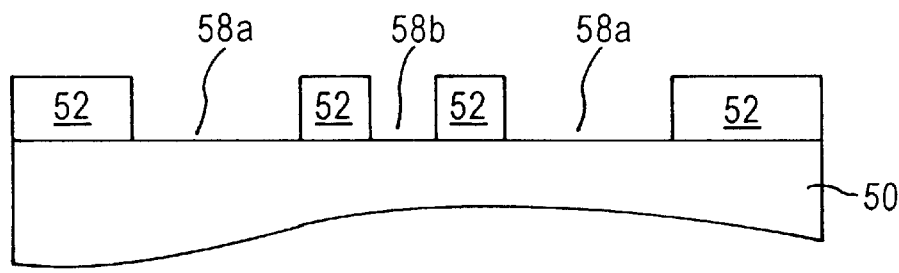
FIG. 3B depicts the portion of FIG. 2A, following an initial dielectric layer etching process in which first slot regions for conductive lines and a second conductive line for an air gap insulation region are formed, and the subsequent photoresist layer removal process.

In FIG. 3B, the semiconductor wafer is placed within an etching tool and an etching process is performed to remove portions of the initial dielectric layer 52 that are located below the etch windows 56a and 56b. Conductive line openings 58a and air gap opening 58b are created through the etch windows 56a and 56b respectively, extending through the initial dielectric layer 52 to the substrate 50. The photoresist layer 54 is then removed from the top surface of the initial dielectric layer 52. As explained above with reference to FIG. 1A and FIG. 1B, air gap openings are arranged to be selectively formed in the high parasitic capacitance region 9.

Figure 3C:
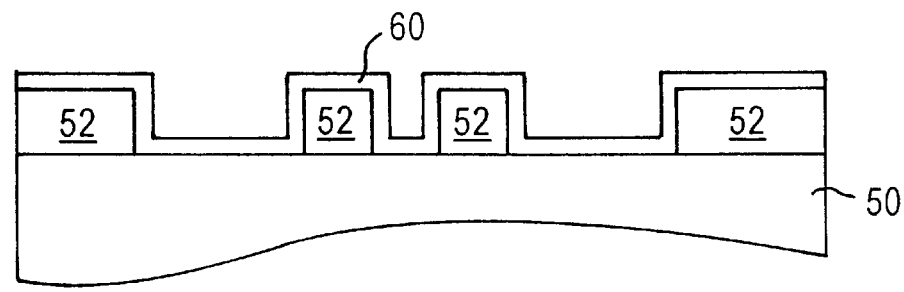
FIG. 3C depicts the portion of FIG. 3B following a dielectric layer deposition process over the substrate and the patterned initial dielectric layer.

In FIG. 3C, a dielectric layer 60 is formed over the substrate 50 and side and top surfaces of conductive line openings 58a and air gap insulation opening 58b. For example, a copolymer made from tetraflouroethylene and 2,2-bis(tritluoromethyl)-4,5-difluoro-1,3-dioxole (TFE AF) is deposited by conventional deposition techniques, such as, chemical vapor deposition (CVD) or plasma enhanced CVD (PECVD) techniques to form the dielectric layer 60.

Figure 3D:
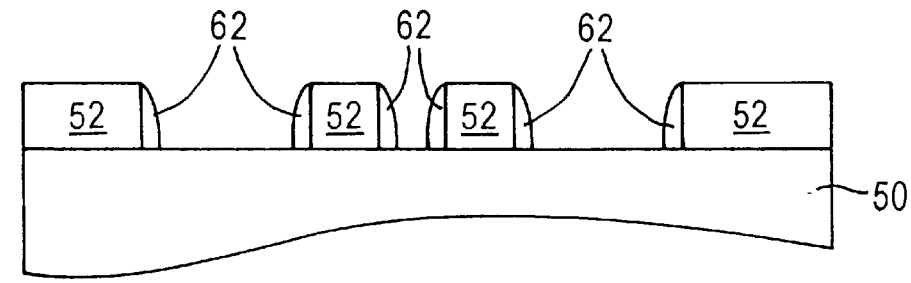
FIG. 3D depicts the portion of FIG. 3C following an anisotropic etching process to form sidewall spacers on the side surfaces of the patterned initial dielectric layer.

In FIG. 3D, the TFE AF dielectric layer 60 is etched by conventional anisotropic etching techniques. Accordingly, portions of the TFE AF layer 60 formed on the top surface of the initial dielectric layer 52 and the substrate 50 are removed except the portions on the side surfaces of conductive line openings 58a and air gap insulation opening 58b, thereby forming sidewall spacers 62 having non-wetting surfaces.

Figure 3E:
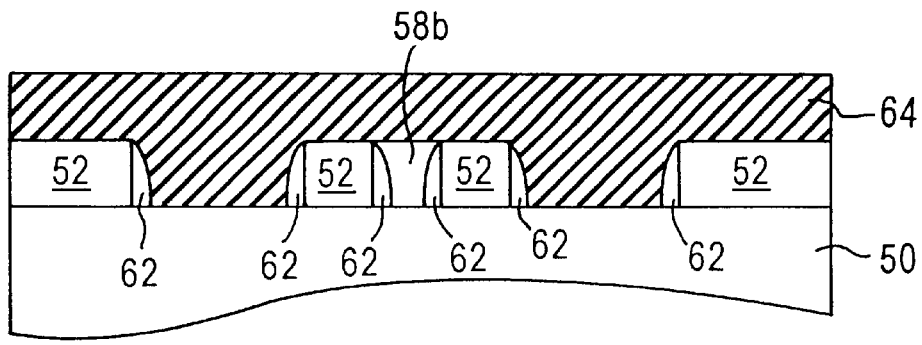
FIG. 3E depicts the portion of FIG. 3D following a conductive material deposition process.

In FIG. 3E, a conductive material, such as a metal, a metal alloy or polysilicon, is formed over the substrate, filling the conductive line openings 58a by conventional deposition techniques, such as, chemical vapor deposition (CVD) or plasma enhanced CVD (PECVD) techniques, thereby forming a conductive layer 64 over the substrate 50. While tenon-wetting sidewall spacers 62 discourage deposition of the conductive material within the air gap opening 58b, the deposition of the conductive material within the conductive line openings 58a is not substantially discouraged by the sidewall spacers 62 because the exposed surface of the substrate 50 within the conductive line openings 58a overweigh the influence of the sidewall spacers 62 in the conductive material deposition process.

Figure 3F:
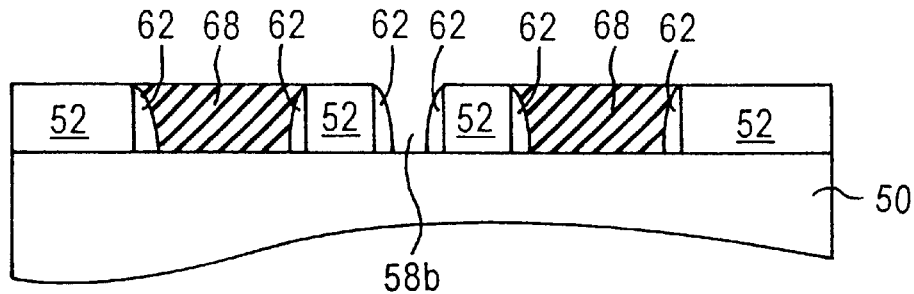
FIG. 3F depicts the portion of FIG. 3E following a covering dielectric layer deposition process.

In FIG. 3F, the semiconductor wafer is placed within an etching tool and an etching-back process is performed to remove an upper portion of the conductive layer 64, thereby forming conductive lines 68 within the conductive line openings 58a.

Figure 3G:
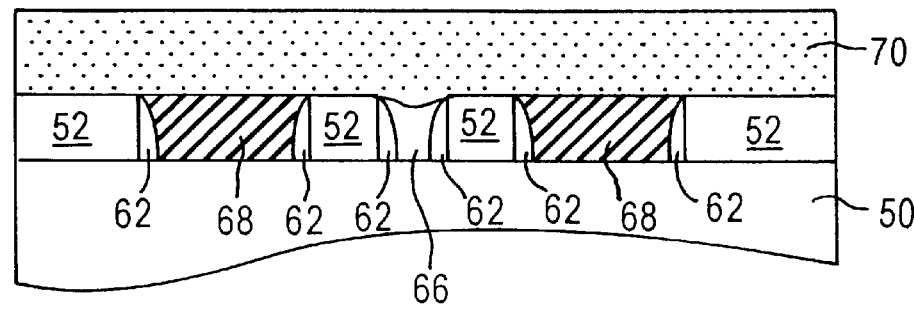
FIG. 3G depicts the portion of FIG. 3F following a covering dielectric layer deposition process, in which an air gap region is formed between the sidewall spacers.

In FIG. 3G, a dielectric material, such as, TEOS, is formed over the initial dielectric layers 52, sidewall spacers 62, conductive lines 68 and air gap opening 58b by conventional deposition techniques, such as, chemical vapor deposition (CVD) or plasma enhanced CVD (PECVD) techniques, thereby forming a covering dielectric 70 over the substrate 50. The TFE AF sidewall spacers 62 formed within the air gap opening 58b prevent the TEOS dielectric material from encroaching into the air gap opening 58b, thereby forming an air gap insulation region 66. Accordingly, the present invention enables the formation of air gap insulation regions selectively within the high parasitic capacitance region.

Figure 4A:
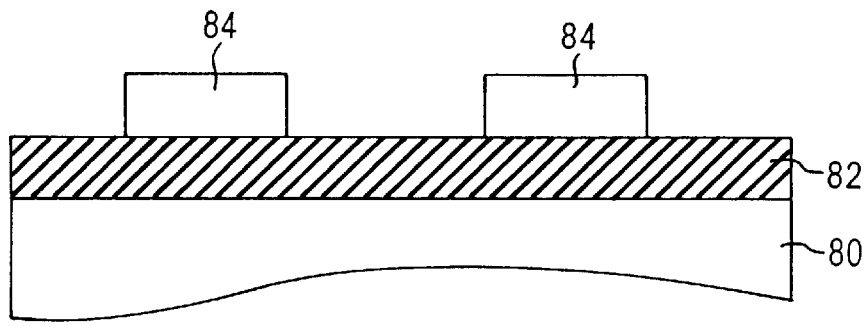
FIG. 4A depicts a cross-section of a portion of a semiconductor wafer having a substrate, a conductive layer, and a patterned photoresist layer, in accordance with another embodiment of the present invention.
Figure 4B:
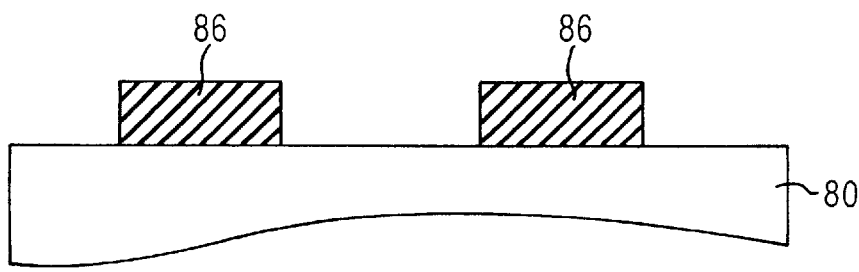
FIG. 4B depicts the portion of FIG. 4A following a conductive layer etching process in which a plurality of conductive lines are formed on the substrate, and a subsequent photoresist layer removing process.
Figure 4C:
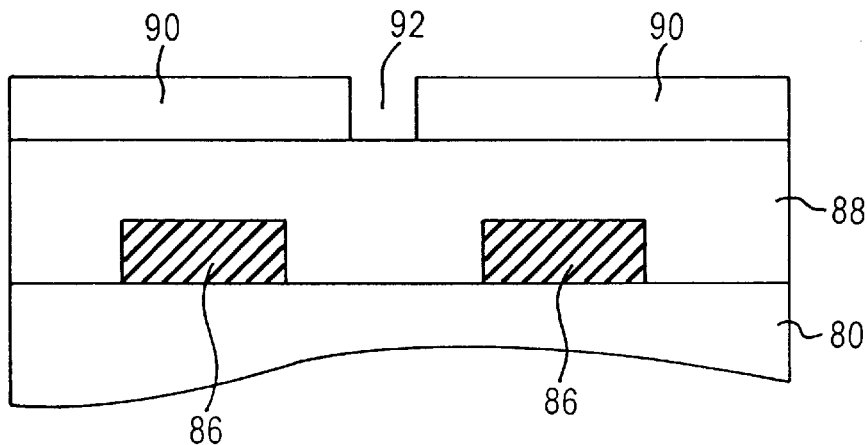
FIG. 4C depicts the portion of FIG. 4B following an initial dielectric layer deposition process and a photoresist layer deposition and patterning processes.
Figure 4D:
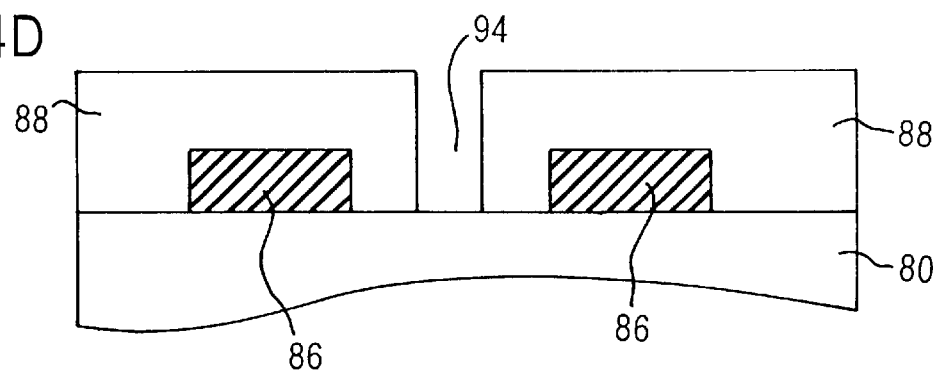
FIG. 4D depicts the portion of FIG. 4C following a dielectric etching process to form an opening between the conductive lines and a subsequent photoresist removing process.
Figure 4E:
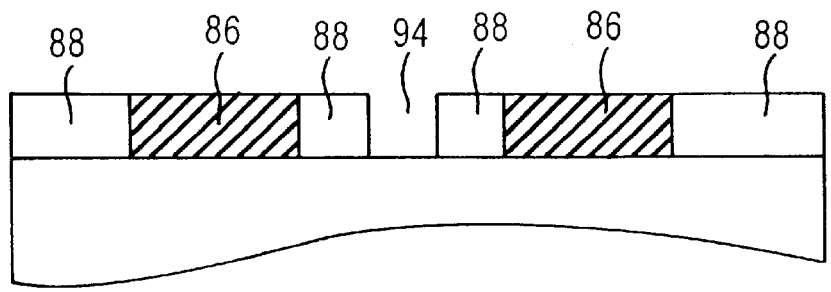
FIG. 4E depicts the portion of FIG. 4D following a dielectric etching-back process in which the initial dielectric layer is etched until the top surface of the conductive lines are exposed.
Figure 4F:
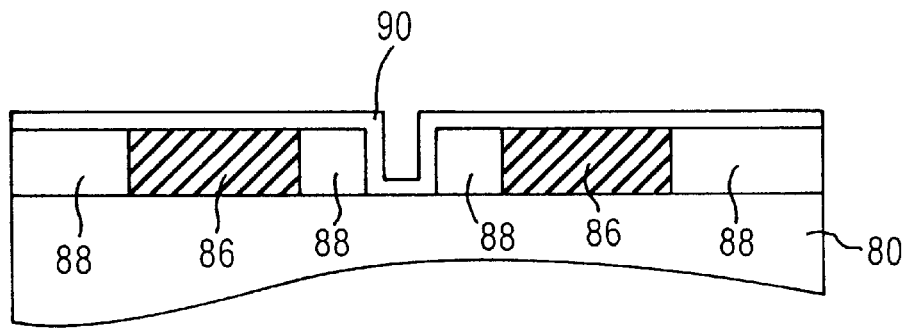
FIG. 4F depicts the portion of FIG. 4E following a dielectric layer deposition process.
Figure 4G:
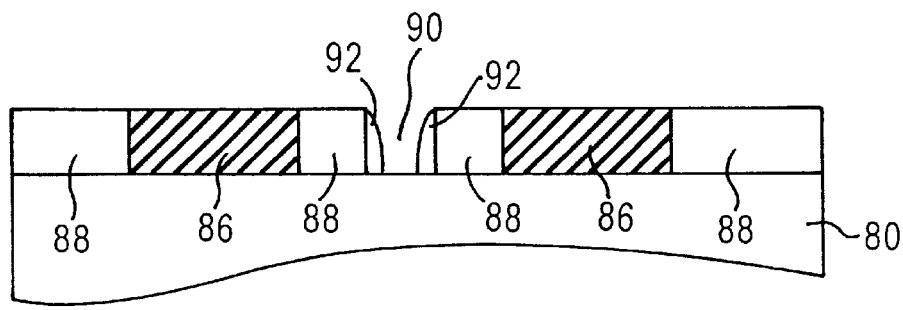
FIG. 4G depicts the portion of FIG. 4F following an anisotropic etching process in which the dielectric layer is etched to form sidewall spacers on the side surfaces of the opening.
Figure 4H:
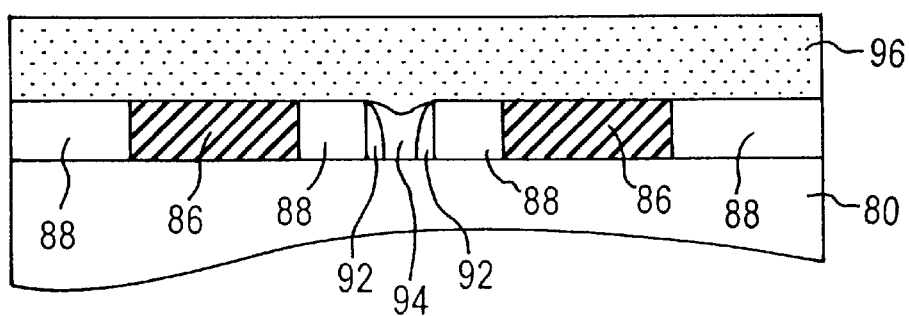
FIG. 4H depicts the portion of FIG. 4G following a covering dielectric layer deposition process, in which an air gap region is formed between the sidewall spacers.

FIG. 4A through FIG. 4H depict another exemplary embodiment, in accordance with the present invention, of which the completed structure is shown in FIG. 4H that is structurally identical to the completed structure of the first embodiment as shown in FIG. 3G. As such, the present invention can be achieved in numerous methods and is not limited to the specific exemplary embodiment described herein.

FIG. 4A depicts a cross-section of a portion including the high parasitic capacitance region of a semiconductor wafer, in accordance with the present invention. The portion includes a substrate 80 and a conductive layer 82, typically at least one of a metal, a metal alloy or polysilicon, is formed on the substrate 80. A first photoresist layer 84 is formed on the conductive layer 82 and patterned with the desired feature that is to be formed in the conductive layer 83.

In FIG. 4B, the semiconductor wafer is placed within an etching tool and an etching process is performed to remove portions of the conductive layer 82 that are not covered the patterned first photoresist layer 84, thereby forming conductive lines 86. The first photoresist layer 84 is then removed from the top surface of the conductive layer 82.

In FIG. 4C, a low k material, e.g., benzocyclobutene (BCB), hydrogen silisesquioxane (HSQ) or FLARE, is formed over the substrate 80 and the conductive lines 86 by conventional deposition techniques, such as, chemical vapor deposition (CVD) or plasma enhanced CVD (PECVD) techniques, thereby forming an initial dielectric layer 88 over the substrate 80. Subsequently, a second photoresist layer 90 is formed over the initial dielectric layer 88 and patterned to create an etch window 92 which defines the air gap insulation region that is to be formed within the high parasitic capacitance region.

In FIG. 4D, the semiconductor wafer is placed within an etching tool and an etching process is performed to remove portions of the initial dielectric layer 88 that are located below the etch windows 92. Accordingly, an air gap opening 94 is created through the etch windows 92, extending through the initial dielectric layer 88 to the substrate 80. The second photoresist layer 90 is then removed from the top surface of the initial dielectric layer 88.

In FIG. 4E, the semiconductor wafer is placed within an etching tool and an etching-back process is performed to remove an upper portion of the initial dielectric layer 88. Accordingly, a substantially planar surface is achieved with an exception of the air gap opening 94.

In FIG. 4F, a dielectric layer 90 is formed over the conductive lines 86 and initial dielectric layer 88 and side and base surfaces of the air gap opening 94. For example, the dielectric layer is formed by depositing a dielectric material, e.g., TFE AF, by using conventional deposition techniques, such as, chemical vapor deposition (CVD) or plasma enhanced CVD (PECVD) techniques.

In FIG. 4G, the TFE AF dielectric layer 90 is etched by conventional anisotropic etching techniques. Accordingly, portions of the TFE AF layer 90 formed on the top surface of the initial dielectric layer 88, the conductive line 86, and the substrate 80 are removed, but the portion of the TFE AF layer 90 on the side surfaces of the air gap opening 90 remain, thereby forming sidewall spacers 92 having non-wetting surfaces within the air gap opening 90.

In FIG. 4H, a dielectric material, such as, for example, TEOS, is formed over the initial dielectric layer 88, sidewall spacers 92, conductive lines 86 and air gap opening 90 by conventional deposition techniques, thereby forming a covering dielectric 96 over the substrate 80. The TFE AF sidewall spacers 92 formed within the air gap opening 90 prevent the TEOS dielectric material from encroaching into the air gap opening 90 during the deposition of the covering dielectric layer 96, thereby forming an air gap insulation region 94.

Accordingly, the present invention enables the formation of air gap insulation regions selectively within areas in which two closely proximate conductive lines generate an excess amount of parasitic capacitance. Since such air gap insulation regions are selectively formed in these selected specific areas, the stress fracture problem of a covering dielectric layer is significantly reduced. As such, the method of the present invention increases device performance by reducing parasitic capacitance and improves device reliability by avoiding stress fracture.

Given the guidance of the present disclosure and disclosed objectives, the optimum material, distance, width, and capacitance can be easily determined in a particular situation.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for manufacturing a semiconductor device, comprising steps of:

forming a plurality of conductive lines on a substrate, the conductive lines comprising first portions having a first distance between two proximate conductive lines and second portions having a second distance greater than the first distance between the two proximate conductive lines;

selectively forming at least one air gap insulation region between the first portions of the two proximate conductive lines;

forming a covering dielectric layer over the substrate, the plurality of conductive lines, and the air gap insulation region;

wherein the step of forming the plurality of conductive lines further comprises:

forming an initial dielectric layer on the substrate;

forming a photoresist layer on the initial dielectric layer;

patterning the photoresist layer to define first slot openings for the plurality of conductive lines and at least one second slot opening for the air gap insulation region within the initial dielectric layer;

exposing the initial dielectric layer to an etchant to remove unmasked portions of the initial dielectric layer and to form the first and second slot openings within the initial dielectric layer; and forming the plurality of conductive lines by filling the first slot openings with a conductive material.

2. The method of claim 1, wherein the covering dielectric layer comprises TEOS.

3. The method of claim 1, wherein the initial dielectric layer comprises a low k material.

4. The method of claim 3, wherein the low k dielectric material is one of benzocyclobutene (BCB), hydrogen silisesquioxane (HSQ) or FLARE.

5. The method of claim 1, further comprising the step of forming sidewall spacers on side surfaces of the second slot openings after exposing the initial dielectric layer to the etchant.

6. The method of claim 1, wherein the covering dielectric layer is formed over the initial dielectric layer, the plurality of conductive lines and the at least one air gap insulation region.

* * * * *